US010640866B2

(12) United States Patent
Babenko et al.

(10) Patent No.: US 10,640,866 B2
(45) Date of Patent: May 5, 2020

(54) PROCESS FOR THE PRODUCTION OF TWO-DIMENSIONAL NANOMATERIALS

(71) Applicant: OXFORD UNIVERSITY INNOVATION LIMITED, Oxford (GB)

(72) Inventors: Vitaliy Babenko, Oxford (GB); Nicole Grobert, Oxford (GB)

(73) Assignee: Oxford University Innovation Limited, Oxford (GB)

( * ) Notice: Subject to any disclaimer, the term of this patent is extended or adjusted under 35 U.S.C. 154(b) by 283 days.

(21) Appl. No.: 15/300,540

(22) PCT Filed: Mar. 31, 2015

(86) PCT No.: PCT/GB2015/050997
§ 371 (c)(1),
(2) Date: Sep. 29, 2016

(87) PCT Pub. No.: WO2015/150791
PCT Pub. Date: Oct. 8, 2015

(65) Prior Publication Data
US 2017/0114450 A1  Apr. 27, 2017

(30) Foreign Application Priority Data
Mar. 31, 2014 (GB) .................. 1405800.2

(51) Int. Cl.
*C23C 16/01* (2006.01)
*C23C 16/00* (2006.01)
(Continued)

(52) U.S. Cl.
CPC .......... *C23C 16/003* (2013.01); *C01B 21/064* (2013.01); *C01B 21/0646* (2013.01);
(Continued)

(58) Field of Classification Search
CPC ....... C23C 16/003; C23C 16/01; C23C 16/26; C23C 16/305; C23C 16/342; C23C 16/40; C23C 16/44
See application file for complete search history.

(56) References Cited

U.S. PATENT DOCUMENTS

| 4,132,571 | A * | 1/1979 | Cuomo | ................... C23C 14/02 |
| | | | | 117/74 |
| 6,863,792 | B1 * | 3/2005 | Madou | ................... C25D 11/34 |
| | | | | 205/229 |
| 7,875,545 | B2 | 1/2011 | Ward, III et al. | |
| 2013/0127023 | A1 | 5/2013 | Zenasni | |
| 2013/0213697 | A1 * | 8/2013 | Palaniswamy | ........ H01L 33/486 |
| | | | | 174/254 |
| 2014/0072836 | A1 * | 3/2014 | Mills | ........................ C25B 1/04 |
| | | | | 429/8 |

FOREIGN PATENT DOCUMENTS

CN          102583359 A        7/2012

OTHER PUBLICATIONS

Juang et al, "Synthesis of graphene on silicon carbide substrates at low temperature", Carbon, vol. 47, 2009, pp. 2026-2031. Mar. 31, 2009.

(Continued)

*Primary Examiner* — Jacob T Minskey
(74) *Attorney, Agent, or Firm* — Hodgson Russ LLP

(57) ABSTRACT

The present invention provides a process for producing a two-dimensional nanomaterial, the process comprising forming the two-dimensional nanomaterial on a surface of a substrate by CVD, wherein said surface is a liquid surface which comprises a molten eutectic compound. Substrates and substrate precursors for use in said process are also provided.

17 Claims, 7 Drawing Sheets

(51) Int. Cl.

| | |
|---|---|
| *C23C 16/26* | (2006.01) |
| *C23C 16/34* | (2006.01) |
| *C01B 21/064* | (2006.01) |
| *C01B 35/08* | (2006.01) |
| *C01B 32/186* | (2017.01) |
| *C23C 16/30* | (2006.01) |
| *C23C 16/40* | (2006.01) |
| *C23C 16/44* | (2006.01) |
| *B82Y 30/00* | (2011.01) |
| *B82Y 40/00* | (2011.01) |

(52) U.S. Cl.
CPC ............ *C01B 32/186* (2017.08); *C01B 35/08* (2013.01); *C23C 16/01* (2013.01); *C23C 16/26* (2013.01); *C23C 16/305* (2013.01); *C23C 16/342* (2013.01); *C23C 16/40* (2013.01); *C23C 16/44* (2013.01); *B82Y 30/00* (2013.01); *B82Y 40/00* (2013.01); *C01B 2204/02* (2013.01); *Y10S 977/734* (2013.01); *Y10S 977/843* (2013.01)

(56) References Cited

OTHER PUBLICATIONS

Lizzit et al, "Transfer-Free Electrical Insulation of Epitaxial Graphene from its Metal Substrate", Nano Letters, 2012, 12, pp. 4503-4507. Aug. 7, 2012.

Vilkov et al, "Controlled assembly of graphene-capped nickel, cobalt and iron silicides", Scientific Reports 3, 2168, 2013. Jul. 9, 2013.

Escobedo-Cousin et al, "Local solid phase growth of few-layer graphene on silicon carbide from nickel silicide supersaturated with carbon", J. Appl. Phys., 113(11), 2013. 2013.

Zenasni et al, "Free-suspended graphene synthesis via carbon diffusion through platinum-based metal", J. Appl. Phys. 100(15), 2012. 2012.

Ding, G., et al., Chemical vapor deposition of graphene on liquid metal catalysts, Carbon, Nov. 17, 2012, vol. 53, No. 17, pp. 321-326.

\* cited by examiner

PROCESS FOR THE PRODUCTION OF TWO-DIMENSIONAL NANOMATERIALS

The work leading to this invention has received funding from the European Community's Seventh Framework Programme (FP7/2007-2013) under grant agreement no. 240500.

FIELD OF THE INVENTION

This invention relates to the production of two-dimensional nanomaterials by chemical vapour deposition (CVD). In particular, the invention relates to processes and substrates for the production of graphene and other two-dimensional nanomaterials by CVD.

BACKGROUND TO THE INVENTION

Superior quality graphene is highly sought in modern research due to the many desirable properties that it possesses. Graphene is a promising candidate for use in a wide variety of applications such as transparent flexible electrodes, photonic devices, energy storage, gas sensors and filters, transistors, coatings and solar energy and many more. Exceptional electrical, optical and mechanical properties of the material depend greatly on the quality of the synthesised graphene and the underlying substrate. Notably, the production of large area, single crystal graphene with a controlled number of layers has been an unyielding problem.

Chemical vapour deposition (CVD) has received much attention due to its simplicity, improved safety and low cost. However, in order to produce large area, single crystal graphene by CVD, the kinetics of the synthesis must be finely balanced. In most cases this is achieved only with low growth rates of up to 5 μm/min. The synthesis time is thus lengthy and significant quantities of source materials must be used. Moreover, when a solid substrate is used with CVD, graphene growth is strongly influenced by the crystallographic lattice of the substrate, as well as its defects, roughness and grain boundaries. A variety of methods are commonly used to attempt to artificially increase substrate grain size, eliminate grain boundaries and decrease the roughness of the surface. Examples of such methods include long annealing or reuse of the substrate, as well as mechanical, chemical and/or electrochemical polishing, and melting and re-solidification of the substrate. However, these methods are time and energy consuming, and thus costly. Alternatively, expensive single crystal substrates of limited size have been used, but such substrates cannot be upscaled.

There remains a need in the art for improved processes for the production of two-dimensional nanomaterials, in particular graphene.

SUMMARY OF THE INVENTION

According to the present invention, there is provided a process for producing a two-dimensional nanomaterial, the process comprising forming the two-dimensional nanomaterial on a surface of a substrate by CVD, wherein said surface is a liquid surface which comprises a molten eutectic compound.

Also provided is a substrate for use in the production of a two-dimensional nanomaterial by CVD, wherein the substrate comprises a surface on which a two-dimensional nanomaterial can be formed and wherein said surface comprises a eutectic compound.

Also provided is a substrate precursor for use in the production of a said substrate, the substrate precursor comprising a first layer formed of a first material and, disposed thereon, a second layer formed of a second material, wherein the first material and the second material are capable of reacting to form a eutectic compound at said surface of the substrate.

The processes and substrates of the present invention may be advantageous in a number of respects. For instance, by employing a material which forms a liquid surface on the substrate, it may be possible to minimise the influence of any topographic defects on the quality of the resulting two-dimensional nanomaterials. In addition, since the lattice of the substrate will be substantially screened by the liquid surface, the two-dimensional nanomaterial may be allowed to grow in its natural shape (e.g. graphene may be allowed to grow in its natural hexagonal shape). The chemical kinetics of the synthesis may also be changed. Thus, two-dimensional nanomaterials produced by the present processes may exhibit low nucleation density and high growth rates, allowing millimeter-sized flakes to grow easily in short time periods compared to methods which do not utilise a liquid surface on the substrate. Moreover, conventional substrate preparation steps (e.g. polishing, chemical and/or electrochemical etching, or long annealing) may be largely obviated.

BRIEF DESCRIPTION OF THE DRAWINGS

FIGS. 1a, 1b and 1c show representative SEM images of graphene on silicidated platinum at 1050° C., 1060° C. and 1155° C. respectively (scale bar: 1 mm). FIGS. 1d and 1e show a plot of graphene growth rate and its nucleation point separation as a function of temperature. The vertical error bars were calculated either from different experiments or from one experiment, whichever was larger. FIG. 1f shows monolayer polycrystalline graphene on clean platinum (i.e. platinum not subjected to silicidification).

a thin liquid silicide layer (not distinguishable from Pt in an SEM) covers the substrate and fills in any valleys or Pt grain boundaries; (d) graphene is grown on the silicidated substrate; and (e) the silicide layer is optionally oxidised by oxygen intercalation underneath graphene to form transfer-free graphene on an insulating substrate. Scale bars: a-c) 1 mm, d) 400 µm.

Figure 5:
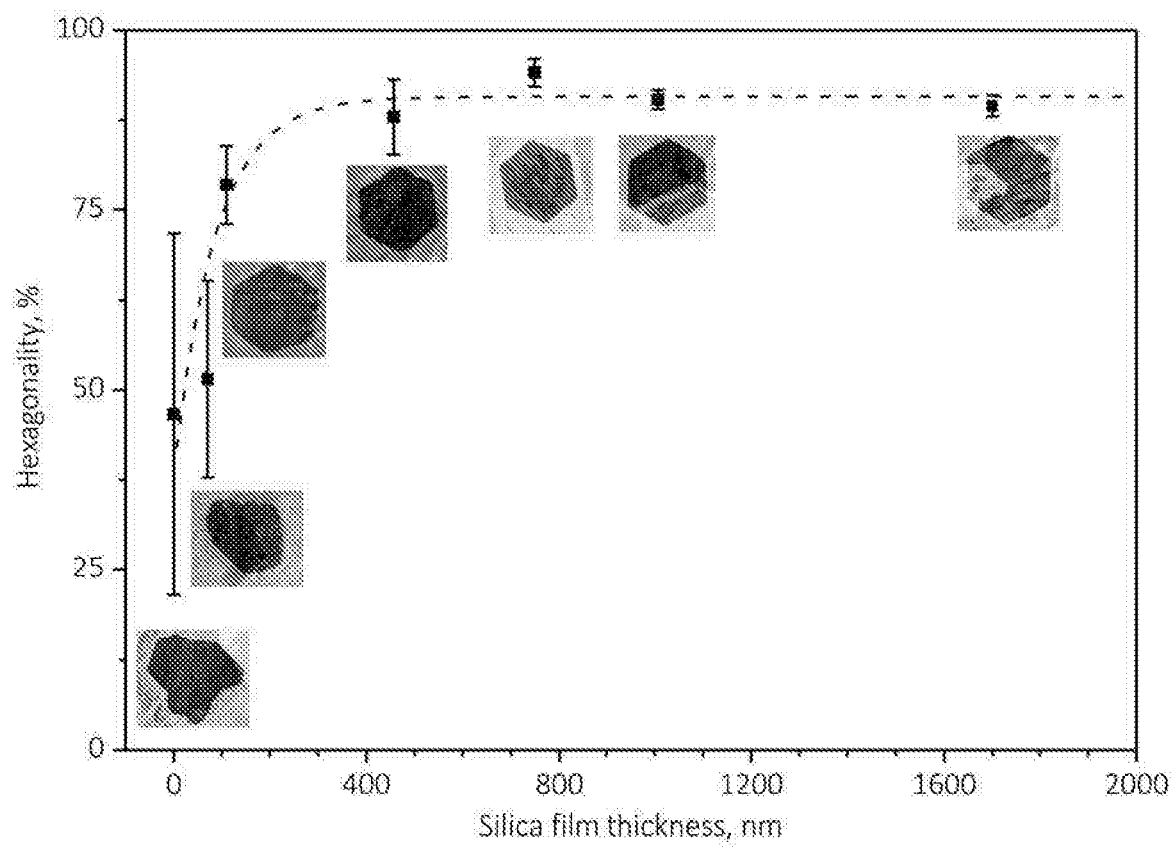

FIG. 5 illustrates the influence of the silica layer thickness on the hexagonality and thus the crystallinity of the CVD graphene. With increased silica layer thickness the crystallinity and the shape uniformity increases. Error bars represent the distribution of shapes on the sample.

DESCRIPTION OF VARIOUS EMBODIMENTS

The present invention relates to processes and substrates for the production of two-dimensional nanomaterials by CVD. Two-dimensional nanomaterials generally comprise one or more atomically thin crystalline repeating units referred to as monolayers (or nanosheets). Monolayers may be crystalline, polycrystalline or amorphous. Preferably, the monolayers present in the two-dimensional materials produced herein are crystalline. The thickness of a monolayer will depend on the composition of the material. For example, a monolayer of graphene is generally one atom thick, whereas in other materials a monolayer may be formed of sandwiched sheets of atoms. A two-dimensional nanomaterial may comprise a single monolayer or a plurality of monolayers stacked together. Where more than one monolayer is present, the monolayers may be weakly bonded by van der Waals interactions. The two-dimensional nanomaterial may comprise from 1 to about 20 monolayers, e.g. from 1 to about 10 monolayers, e.g. from 1 to about 5 monolayers. The two-dimensional nanomaterial may have a thickness ranging from about 0.3 nm to about 10 nm, e.g. from about 0.3 nm to about 5 nm, e.g. from about 0.3 nm to about 2.5 nm. The dimensions of the two-dimensional nanomaterial and the number of monolayers present may be determined using techniques known in the art. The thickness of the structure in one dimension, out of the three, is generally sufficiently small for the quantum confinement to be substantial to give the materials additional properties distinctive from the bulk material. For example, the Raman spectroscopy signal of a given material may vary depending on the thickness of the material and thus can be used for characterisation. For graphene, these effects are visible up to tens of stacked carbon layers.

In an embodiment, the two-dimensional nanomaterial is graphene, a graphene derivative (e.g. doped graphene, graphene oxide, fluorographene or chlorographene), boron nitride or a transition metal chalcogenide. In an embodiment, the nanomaterial contains one or more lattice dopants or pyridinic species. Examples of suitable dopants for graphene include nitrogen, boron, phosphorus and silicon. Examples of pyridinic species include fluorine and chlorine.

More preferably, the two-dimensional nanomaterial is graphene. In particular, the present processes may be used to produce monolayer, bilayer or few-layer graphene. The term "monolayer" as used herein in connection with graphene refers to a single, atom-thick layer of graphene. A monolayer of graphene may be polycrystalline, in which case the lattice may have line defects or crystal boundaries. Alternatively, a monolayer of graphene may be a single crystal, in which case the lattice does not have line defects, but may include occasional point-defects (such as five- or seven-membered rings). The term "bilayer" refers to a graphene structure having two layers of graphene, with one overlying the other. The term "few-layer" refers to stacks of monolayers of graphene, typically up to tens of layers. Single-crystal or polycrystalline, monolayer, bilayer or few-layer graphene or their combinations may be produced by the present processes. The stacked layers need not be of the same size, morphology or coverage.

Similarly, monolayer, bilayer or few-layer two-dimensional nanomaterials other than graphene may be produced using a process of the present invention. The number of layers may change the electronic properties of said materials, such as bandgap, which is important for many applications (such as in electronics or photonics).

The present processes involve forming the two-dimensional nanomaterial on a surface of a substrate by CVD, wherein the surface is a liquid surface and comprises a molten eutectic compound. Thus, the substrate presents an exposed, outer surface upon which the two-dimensional nanomaterial is formed, which surface is in the liquid phase and comprises the eutectic compound in molten form. Advantageously, the use of a smooth liquid surface for the growth of two-dimensional nanomaterials may remove the dependence of the material growth on the crystallographic orientation of the substrate or its roughness, thus improving the crystallinity of the two-dimensional nanomaterial.

The eutectic compound may be a binary, tertiary or higher eutectic compound. Preferably the eutectic compound is a binary eutectic compound. In a preferred embodiment, the eutectic compound is a metal silicide. Preferably, the metal silicide is a platinum silicide (e.g. comprising a $Pt_3Si$ stoichiometry when solidified), a palladium silicide (e.g. comprising a $Pd_5Si$ or $Pd_3Si$ stoichiometry when solidified), a copper silicide or a nickel silicide.

The liquid surface may be formed by heating the substrate to a temperature at or above the melting point of the eutectic compound, so as to obtain the eutectic compound in molten form. In embodiments in which the substrate is provided with the eutectic compound in a solidified form, the substrate can be heated to melt the eutectic compound and form the liquid surface. Alternatively, the process may comprise a step of forming the substrate. In this case, the step of forming the substrate may be conducted at a temperature at or above the melting point of the resulting eutectic compound, such that the substrate is produced comprising the eutectic compound in molten form. In this case, the need for a separate heating step is obviated.

The substrate is preferably heated to a temperature at or above the melting point of the eutectic compound, but below the melting point of any precursors of the eutectic compound that are present in the substrate. Thus, for example, where the substrate comprises a eutectic compound which is a metal silicide and the substrate further comprises the metal and/or silicon-containing precursors for said compound, the substrate is preferably heated to a temperature at or above the melting point of the metal silicide, but below the melting point of said precursors. In an embodiment, the liquid surface is obtained by heating the substrate to a temperature of from about 800° C. to about 1300° C., e.g. a temperature of from about 800° C. to about 1200° C.

Advantageously, the present processes exploit the reduced melting points afforded by eutectic compounds as compared to those of their precursor compounds and other substrates commonly used for CVD. By way of illustration, and without limitation, the use of a substrate comprising platinum silicide as the eutectic compound may be advantageous as compared with the use of conventional copper substrates, as platinum silicide (with a stoichiometry of $Pt_3Si$) melts at approximately 830° C., whereas copper melts at a temperature of approximately 1085° C.

During formation of the liquid surface, some of the material forming the liquid surface may evaporate from the surface of the substrate, diffuse into the bulk, and/or fill any topographical defects (e.g. grain boundaries). As a consequence, the thickness of the substrate may be reduced when the liquid surface is formed. Substantially all of the surface of the substrate may be converted to form a liquid, or only a portion of the surface of the substrate may be converted to a liquid.

The remainder of the substrate is preferably substantially solidified. Thus, the liquid surface will typically be disposed on a portion of the substrate that is in a substantially solid form. There may be a gradient of chemical composition and phase within the substrate, such that the substrate may gradually change chemical composition and phase with thickness. In an embodiment, the remainder of the substrate comprises one or more of the precursors of the eutectic compound. Thus, for example, where the eutectic compound is a metal silicide, the one or more precursors may include one or both of a metal and a silicon-containing species. In this case, the liquid surface may be disposed on a layer consisting substantially of the metal or the silicon-containing species.

In a preferred embodiment, the substrate is formed from a substrate precursor which comprises a first layer formed of a first material and, disposed on a surface thereof, a second layer formed of a second material, wherein the first material and the second material are capable of reacting to form the eutectic compound. The substrate may be formed by conditioning the substrate precursor such that the first and second materials react to form the eutectic compound. The substrate precursor may be of any suitable construction, e.g. it may be in the form of a foil, film or foam.

The first layer may comprise any suitable material known for use as a substrate in processes for the growth of two-dimensional nanomaterials by CVD. Materials that promote the breakdown of the precursor(s) used to form the two-dimensional nanomaterial, but which have low precursor constituent solubility, are especially preferred. The first layer may comprise a single metal, a mixture or alloy of two or more metals, e.g. an amorphous metal alloy. The first layer may comprise a polycrystalline material or a single crystal material. Preferably, the first layer comprises a polycrystalline material, e.g. a polycrystalline metal. The first layer preferably comprises one or more planes of metal atoms on the surface of said layer.

In a preferred embodiment, the first layer comprises a transition metal, e.g. a transition metal selected from platinum, palladium, nickel or copper. In a particular embodiment, the first layer comprises platinum or palladium. The use of platinum or palladium is preferred as these metals act as particularly effective catalysts for the growth of two-dimensional nanomaterials. Moreover, the high melting points of these metals allow high temperatures to be utilised, as well as the achievement of exceptional growth rates of single crystal monolayer graphene (e.g. growth rates of 125 µm/min on platinum at 1150° C. have been achieved). The possibility to reuse the present substrates due to their inertness is also advantageous having regard to their cost, and it has been found that the substrates may be reused for synthesis after e.g. a non-destructive graphene transfer.

In an embodiment, the first layer has a thickness of from about 1 nm to about 1 cm. In an embodiment, the first layer is the form of a metallic foil having a thickness of from about 1 µm to about 100 µm. In another embodiment, the first layer is the form of a metallic film having a thickness or from about 1 nm to 1000 nm.

In an embodiment, the second material comprises a silicon-containing species, e.g. the second material comprises one or more of Si, SiO, $SiO_2$, and SiN. In instances where the second material comprises a silicon-containing species, the second layer may be formed using e.g. a tetraethyl orthosilicate (TEOS) precursor. In a particular embodiment, the second material comprises a silicon-containing species which reacts with a metal-containing first material to form a eutectic compound which is a metal silicide. Preferably, the metal silicide is a platinum silicide, a palladium silicide, a copper silicide or a nickel silicide.

The second layer may cover substantially all of said surface of the first layer or only a portion of said surface. Particularly in instances where the first layer comprises a polycrystalline material, the surface of the first layer may not be smooth and/or it may comprise topographic defects prior to application of the second layer and formation of the liquid surface. Topographic defects are deviations of a surface from a perfectly flat plane, for example peak and troughs in the surface. Such defects may be due to the presence of grain boundaries in the surface of the substrate. By coating the surface of the first layer with the second layer, any topographic defects present in the surface of the first layer may be filled or locally smoothed by the liquid surface. In particular, the lattice of the substrate may be largely screened by the liquid surface, allowing the crystallinity of the two-dimensional nanomaterial to be improved.

The thickness of the second layer may vary depending on the chemical composition and the thickness of the first layer. In an embodiment, the second layer has a thickness of from about 1 nm to about 1 mm. Preferably, the second layer has a thickness of from about 50 nm to about 1000 nm. The second layer may be of any suitable construction, e.g. it may be in the form of a foil, film or foam.

The second layer may be deposited onto the first layer via any suitable procedure known in the art. For example, CVD, thermal or e-beam evaporation, sol-gel deposition, sputter coating or ion implantation may be used. In a preferred embodiment, the second layer is deposited on the first layer via CVD. In an embodiment, a one-step CVD-based process with TEOS precursor introduced by an argon carrier gas is used.

The substrate precursor may contain one or more layers in addition to said first and second layers. For example, a substrate precursor may be used in which the first layer is sandwiched between the second layer and a third layer. In this case, the third layer may be formed of a material which is unreactive with the first and second materials, and which acts as a solid support for the first and second layers of the substrate. Thus, for example, the third layer may comprise a material such as boron nitride. In instances where the substrate comprises a third layer (and optionally one or more additional layers besides), substantially all of the first and second materials may be converted to the eutectic compound, such that the resulting substrate comprises a layer of the eutectic compound disposed directly on the third layer. In this case, it may be possible to use a substrate precursor in which the first layer is sandwiched between the third layer and the second layer, or a substrate precursor in which the second layer is sandwiched between the first layer and the third layer. Preferably, the first layer is sandwiched between the second layer and the third layer. The various layers of the substrate may be formed using suitable techniques known in the art. For example, CVD, thermal or e-beam evaporation, sol-gel deposition, sputter coating or ion implantation may be used In an alternative embodiment, the substrate is formed from a substrate precursor which comprises a first layer, and disposed on a surface thereof, a second layer, wherein the first layer is formed of a material that is unreactive with the second layer and wherein the second layer comprises the precursor species for the eutectic compound. Thus, for example, the second layer may comprise a co-deposited precursor species containing a metallic element (e.g. Pt(II) acetylacetonate, or Pd) and a species of another precursor (e.g. Si, $SiO_2$ or TEOS), wherein the precursors are co-deposited in the correct stoichiometry so as to form a desired eutectic compound (e.g. Pt and Si may be added in a 3:1 ratio respectively to form $Pt_3Si$ when heated).

The substrate is formed by conditioning the substrate precursor such that the precursors of the eutectic compound react to form said compound. Preferably, the conditioning step involves heating (annealing) the substrate precursor so as to effect formation of the eutectic compound. In an embodiment, the substrate precursor is heated to a temperature of from about 100° C. to about 800° C. In another embodiment, the substrate precursor is heated to a temperature of from about 800° C. to about 1200° C. The chemical composition and phase of the resulting substrate, as well as the rate of formation of the eutectic compound, may be controlled by varying the temperature at which the conditioning step is performed. As mentioned above, the conditioning step may be conducted at a temperature at or above the melting point of the eutectic compound, such that the eutectic compound is obtained directly in molten form. Thus, for instance, conditioning of the substrate, formation of the liquid surface and growth of the two-dimensional nanomaterial may be conducted in the same CVD chamber, with the process steps performed stepwise or simultaneously.

The substrate is preferably produced under an inert atmosphere, e.g. under an argon atmosphere or under a mixture of argon and hydrogen (e.g. wherein the hydrogen is present at less than 5% by volume). Preferably the eutectic compound is formed under a reducing atmosphere, e.g. under a hydrogen atmosphere. A hydrogen atmosphere is preferred as it may remove common contaminants from the reaction vessel e.g. carbon and oxides.

In order to facilitate formation of the liquid surface, the eutectic compound is preferably formed at an exposed, outer surface of the substrate. The eutectic compound may be obtained in a substantially solidified form which is subsequently melted to provide the liquid surface. Alternatively, the eutectic compound may be obtained directly in liquid form by reacting the first material and the second material at a temperature at or above the melting point of the resulting eutectic compound, but below the melting points of the first and second materials.

The presence of the eutectic compound may be identified using techniques such as energy-dispersive X-ray spectroscopy (EDX), X-ray photoelectron spectroscopy (XPS), X-ray diffraction spectroscopy (XRD), or a combination thereof. The phase diagrams of the elements present in the substrate and their visual appearance in SEM may also provide useful information regarding the state of the surface.

According to a process of the present invention, the two-dimensional nanomaterial is formed on the liquid surface by CVD. Thus, for example, the process may comprise contacting one or more precursors for the two-dimensional nanomaterial on the liquid surface, and forming the two-dimensional nanomaterial thereon. Particularly where the two-dimensional nanomaterial is graphene, the process may comprise contacting the liquid surface with hydrogen and a precursor for the two-dimensional nanomaterial (e.g. methane), wherein the contacting takes place under conditions such that the precursor reacts in the chamber to form said nanomaterial on the liquid surface.

In an embodiment, the two-dimensional nanomaterial is produced by atmospheric-pressure CVD (APCVD). That is, the CVD process is performed at a pressure that is substantially equal to (e.g. equal to) atmospheric pressure. In an embodiment, the two-dimensional nanomaterial is grown under a pressure of about 1 atm.

In an embodiment, the two-dimensional nanomaterial is produced by controlled chamber pressure chemical vapour deposition (CPCVD; e.g. low pressure CVD [LPCVD]), high vacuum CVD (HVCVD), ultra-high vacuum CVD (UHVCVD), or high pressure CVD (HPCVD). In a preferred embodiment, the CVD process may be performed at a pressure below atmospheric pressure, typically usually in the mTorr to tens of Torr pressure range. In an embodiment, the flows and the substrate are contacted in the reaction chamber at defined pressure. The substrate may be conditioned before the synthesis in said controlled pressure chamber.

The temperature in the reaction chamber during formation of the two-dimensional nanomaterial may be any suitable temperature at which the liquid surface remains in liquid form during growth of the two-dimensional nanomaterial. The temperature in the reaction chamber during formation of the two-dimensional nanomaterial will vary depending on the nature of the substrate and/or the precursor that is used. For instance, the temperature in the reaction chamber may range from about 100° C. to about 1700° C., e.g. from about 600° C. to about 1200° C. In a preferred embodiment, the temperature in the reaction chamber is from about 800° C. to about 1200° C., e.g. from about 1000° C. to about 1150° C. The temperature may be maintained throughout the course of the process or it may be varied. In an embodiment, facilitated CVD processes, aimed at reducing the synthesis temperatures or other improvements, such as increasing the growth rates, namely plasma-assisted CVD, UV-assisted CVD and pulsed-CVD may be used with said substrates.

The precursor(s) are contacted with the substrate for an appropriate period of time to enable one or more layers of the two-dimensional nanomaterial to form on a surface of the substrate. In an embodiment, the one or more precursors can be a single-source or a multiple-source containing the chemical elements comprising said 2D-materials. Where the two-dimensional nanomaterial is graphene, the precursor(s) may include e.g. a precursor selected from alkanes (e.g. methane), alkenes, alkynes (e.g. acetylene), aromatic compounds (e.g. benzene) or polymers (e.g. polystyrene). Where the two-dimensional nanomaterial is boron nitride, a precursor selected from ammonia borane, borazine, decaborance/ammonia may be used. Exemplary precursors for transition metal chalcogenides nanomaterials include single-source organometallic precursors, as well as tungsten chlorides and sulfur (to synthesise $WS_2$) and molybdenum oxide and hydrogen sulfide (to form $MoS_2$).

The precursor(s) are contacted with the substrate for a suitable period of time for to achieve partial, full or few layer coverage of the substrate by the two-dimensional nanomaterial. Synthesis times of tens of minutes may be suitable to from monolayer nanomaterial coverage. Longer synthesis times may result in larger or thicker coverage. It will normally be preferable to cool the two-dimensional nanomaterial (e.g. to room temperature) prior to removing it from the reaction chamber. The cooling rate may be used to control one or more properties of the synthesised nanomaterial in particular the morphology of the nanomaterial e.g. to promote or suppress graphene ribbon formation (due to directional cracks).

The present invention also provides two-dimensional nanomaterials which are obtainable by a process of the present invention. The processes described herein are particularly suited to the production of graphene, but it will be appreciated that other two-dimensional nanomaterials may also be produced using the present processes.

In an embodiment, the two-dimensional nanomaterial is graphene, a graphene derivative (e.g. doped graphene, graphene oxide, fluorographene or chlorographene), boron nitride or a transition metal chalcogenide. In an embodiment, the nanomaterial contains one or more lattice dopants or pyridinic species. Examples of suitable dopants for graphene include nitrogen, boron, phosphorus and silicon. Examples of pyridinic species include fluorine and chlorine. A number of techniques may be used to extensively assess the properties of the synthesised nanomaterial, such as its size, shape, crystallinity, number of layers and its electronic properties.

Preferably, the two-dimensional nanomaterial is graphene. In this regard, the present processes may allow high quality continuous graphene layers comprising oriented single crystals having dimensions of the order of microns, millimetres or even centimeters to be used, and it may be possible to produce graphene having even larger sizes.

Two-dimensional nanomaterials produced by a process of the present invention may be used in the manufacture of devices and other products. By way of illustration, the device may be an electronic device, e.g. a semiconductor, a transparent conductor, a display (e.g. a flexible display for a computer screen or other visual display unit), a transistor, a photovoltaic cell. In the present invention, where the conditions are used such that synthesis of graphene ribbons is promoted, exemplary devices may include a strain gauge or anisotropically conducting film.

A process of the present invention may further comprise a step of separating the two-dimensional nanomaterial from the substrate. The two-dimensional nanomaterial may be separated from the substrate by any suitable means known in the art, e.g. following the procedure described by Gao et al (*Nat. Commun.*, 3 (2012)).

However, since the transfer of graphene and other two-dimensional nanomaterials can introduce contaminants and/or result in damage to the nanomaterial, it may be preferable to utilise the two-dimensional nanomaterial in conjunction with the substrate, with the substrate optionally modified as desired. Thus, after formation of the two-dimensional nanomaterial, the properties of the two-dimensional nanomaterial may be exploited directly on the surface of the substrate, as in the case of so-called "transfer-free graphene". Accordingly, the present invention is also directed to composite materials which comprise a two-dimensional nanomaterial disposed on a surface of the substrate of the present invention, in which the substrate is optionally been modified (e.g. oxidised) to alter its chemical and/or physical properties.

In some embodiments, the substrate is further processed to form an insulating or semiconducting layer underneath the nanomaterial (e.g. for transfer-free graphene). Particularly when the substrate is a binary substrate, the electronic properties of graphene may be exploited on the substrate without transfer because of the possibility to convert the surface of the substrate to an insulator. In embodiments in which the substrate comprises a silicon-containing compound, e.g. a eutectic compound which is a metal silicide, oxygen may be intercalated underneath the two-dimensional nanomaterial to oxidise the silicide and form SiO or $SiO_2$. Such a process may be performed e.g. in a vacuum or under ambient atmosphere. The substrate may be also chemically processed to convert the bulk of the substrate to an insulator, e.g. by placing the structure on a silicon support, followed by thermal treatment to achieve a silicide and its subsequent oxidation. Reference may be made to e.g. the procedures described by Lizzit et al. (Nano Letters 12, 2012, 4503).

The following non-limiting Examples illustrate the present invention.

Example 1

The following Example illustrates a process for the production of graphene using a silicidated platinum substrate.

Materials and Methods

Substrate Preparation

A film of $SiO_2$ of specified thickness was deposited onto a 25 μm thick Pt foil (Goodfellow, 99.95% purity, washed in acetone and deionized water) via CVD with a tetraethyl orthosilicate (TEOS) precursor. For example, a $SiO_2$ film of about 1 μm thickness can be deposited on clean Pt with CVD by passing Ar gas (350 sccm) through a TEOS precursor at about 700° C. for 30 minutes. Other methods, such as Si, SiO, $SiO_2$ evaporation, sputtering and sol-gel processes can also be used to deposit the film onto the foil.

Graphene Synthesis

Graphene was synthesised in a standard CVD apparatus at atmospheric pressure with a methane ($CH_4$) and hydrogen ($H_2$) gas mixture. The CVD apparatus consisted of a gas system with three gases: $CH_4$, $H_2$, Ar (99.995% purity), controlled with mass flow controllers. The outlet line with the gas mixture was connected to a quartz tube with ultra-torr fittings and the exhaust gas was let out through a bubbler with acetone. To allow heating and rapid cooling of the samples the furnace was shifted along the quartz tube.

The substrate was placed on a boron nitride holder inside a quartz tube (30 mm diameter). The tube was then purged with Ar (99.995% purity) and shifted into a pre-heated furnace, followed by a 30 minutes annealing in $H_2$ (99.995%, 200 sccm) to allow platinum silicide formation and to stabilize the temperature of the furnace. To synthesise graphene, a mixture of $CH_4/H_2$ was introduced. The ratio of $H_2$ to $CH_4$ was kept high in order to achieve the very low carbon precursor concentration necessary for graphene growth (see Vlassiouk et al., Acs Nano 5, 6069-6076, 2011). The flow rates, gas ratio and the duration of the synthesis depended greatly on the temperature and the silica layer thickness. For example, for a 1 μm thick silica layer at 1070° C. the flow rates were set to 2 sccm $CH_4$ and 300 sccm $H_2$ for 20 minutes, resulting in approximately one mm sized flakes. Directly after this step, the tube was shifted from the furnace and purged with Ar to quench graphene growth (in some experiments the sample was cooled down slower, at rates <30° C./min in oxygen-free argon).

Transfer to $Si/SiO_2$ Substrates and TEM Grids

To remove graphene from the liquid surface the "bubbling transfer" method outlined in Gao et al. (supra) was employed. The sample was coated with poly(methyl methacrylate) (PMMA) and submerged into an electrolyte solution (1 molar NaOH). A current was passed through the solution resulting in bubbles forming between the PMMA and Pt, separating them. PMMA with a graphene layer was then rinsed in deionized water and lifted onto a $Si/SiO_2$ wafer, followed by submerging in acetone for 24 hours. For the TEM grid transfers, the PMMA/graphene layer was either dissolved or burnt in air at 350° C., as outlined in Huang et al. (*Nature* 469, 389-392 (2011)).

Graphene Characterisation

Raman spectra and maps were recorded with a Horiba LabRAM Aramis microscope equipped with a 532 nm laser. Routine SEM characterization was done with a JEOL JSM-6500F microscope. TEM images and SAED patterns were recorded with a JEOL JEM-2010 microscope. AFM measurements were performed using a Cypher AFM (Asylum Research). The thickness of the $SiO_2$ films was measured with a Nanometrics Nanospec AFT interferometer (on co-deposited Si tiles) and some samples were also hecked with ellipsometry directly on a Beaglehole Instruments Picometer Ellipsometer. The XPS was performed on a VG Clam 4 instrument using 200 watt Mg Kalpha X-rays; the data was processed using CASAXPS. XRD analysis was performed on the Bruker D5000 diffractometer.

Results and Discussion

Graphene Characterisation

A number of techniques were used to extensively assess the properties of the synthesised graphene, such as its size, shape, crystallinity, number of layers and its electronics properties. FIGS. 1c and 1f show two characteristic SEM images of graphene flakes on Pt with a silicide layer and on clean Pt. The latter has many reflex angles that indicate numerous grain boundaries, and the edge morphology often varies from one Pt grain to another. The hexagonal graphene flakes of millimeter size on some samples were observed to cross hundreds of the silicidated Pt grains and their boundaries without any effect. Monolayer graphene was easily achieved on all of the Pt substrates, most likely due to the low segregation speed of carbon in Pt that facilitated self-limiting growth. However, the crystallinity and size varied dramatically depending on the experimental conditions. Contrary to the previous study of graphene synthesis on Pt by Gao et al (supra), hexagonal graphene flakes were not observed on substrates not treated with the silicide.

Figure 1:
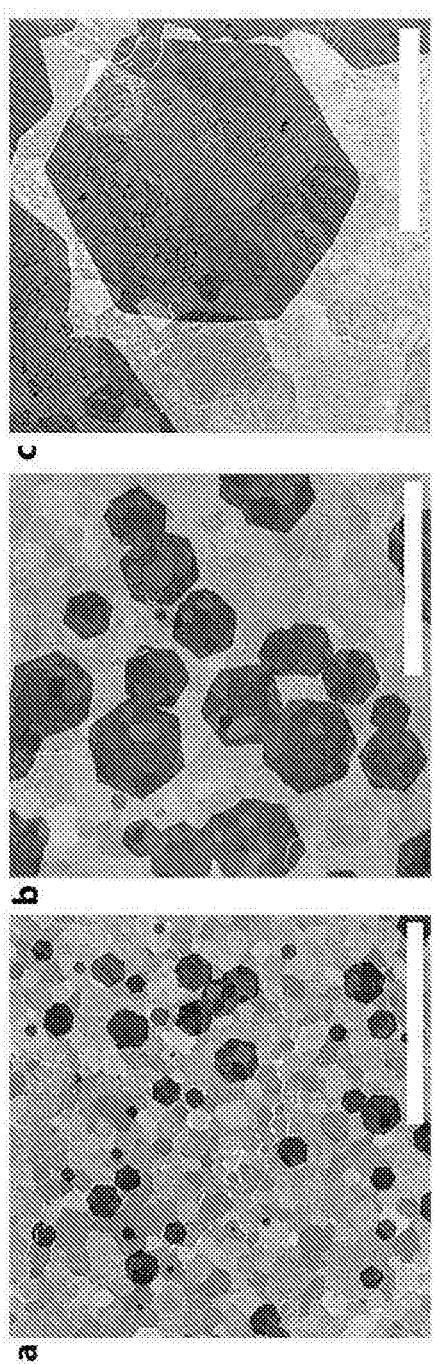
FIG. 1 provides various images and plots relating to the synthesis of graphene.
Figure 1:
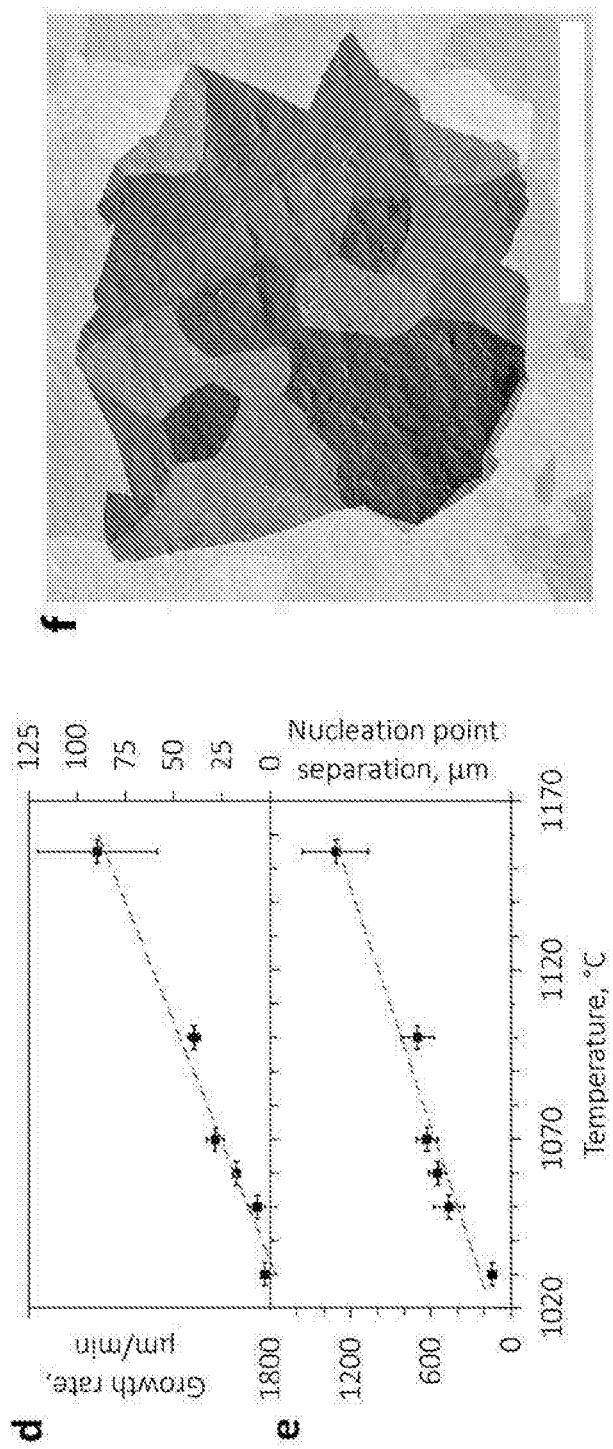

FIG. 1d shows the dependence of the growth rate as a function of temperature on the silicidated substrates, which was found to be approximately linear for the temperature range used. Even without parameter optimisation the growth rate went above 100 μm/min at 1150° C. The nucleation density of graphene flakes also decreased with increased temperature, similar to the trend reported before on Cu in Vlassiouk et al. (*The Journal of Physical Chemistry C* (2013)). On Pt, the flake size was about an order of magnitude larger for the same temperature and time. The nucleation point separation (S), related to the nucleation density as $\pi^{-1}(S/2)^{-2}$, could also be considered approximately linear. The high melting point of Pt allowed us to probe the yet unexplored temperature range above 1100° C. in CVD, at which fem-mm single crystals of graphene were obtained in minutes (see FIG. 1).

Figure 2:
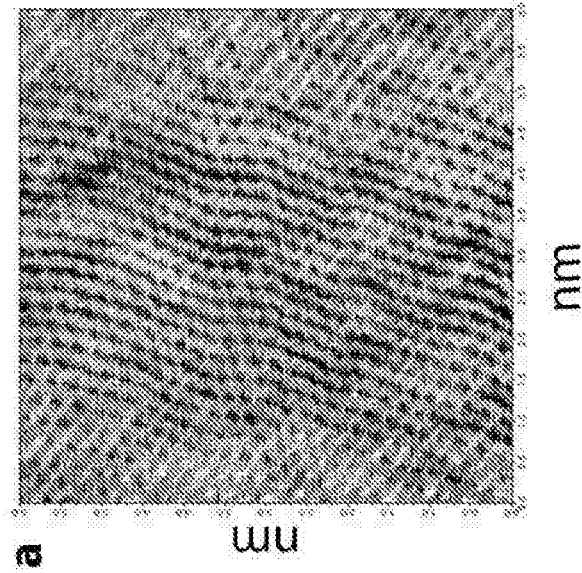
FIG. 2 outlines various graphene characterisation methods: (a) a lattice resolution AFM (Atomic Force Microscopy) image of graphene directly on platinum, with distinguishable graphene cells, indicating good crystallinity from multiple scans; (b) SAED (Selected Area Electron Diffraction) of the synthesised graphene with a line profile (inset); (c) a typical Raman spectra of graphene transferred to $Si/SiO_2$ substrates, indicating monolayer graphene; and (d) graphene ribbons on some Pt grains following rapid thermal quenching (scale bar: 50 μm).
Figure 2:
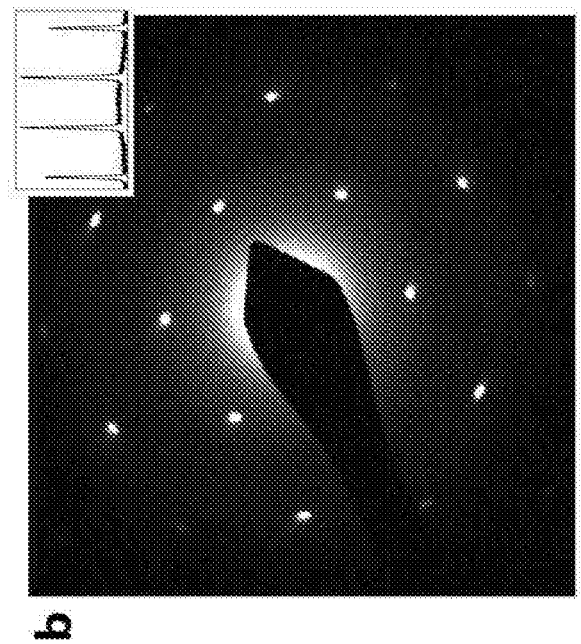
Figure 2:
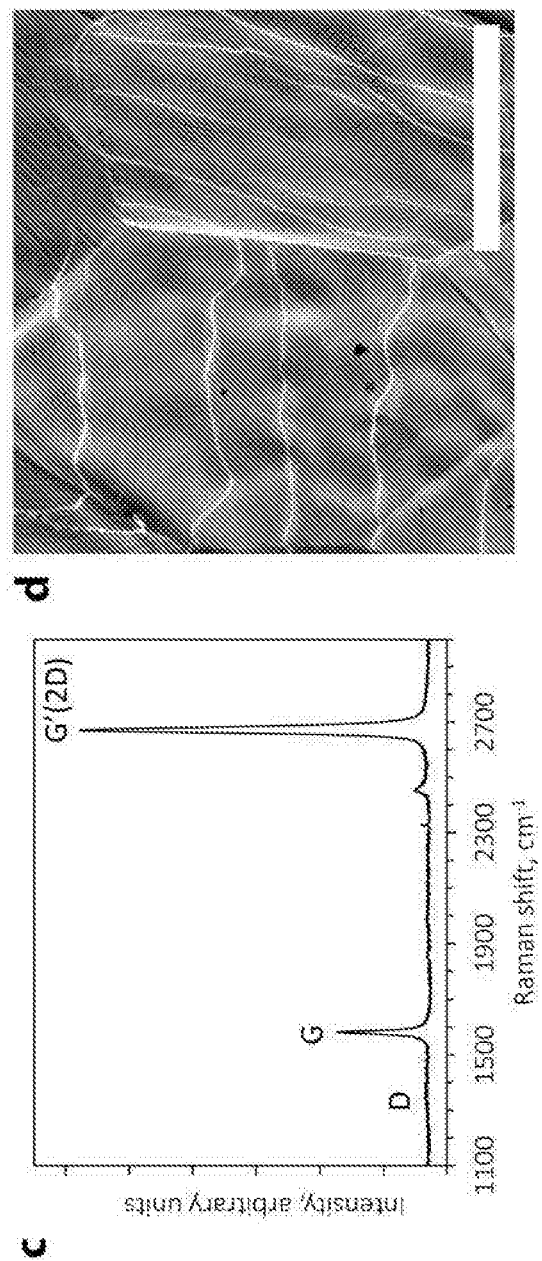

Graphene was transferred to Si/SiO$_2$ substrates for Raman measurements (see FIG. 2c). The D-peak (defect peak) was almost indistinguishable from the background, whereas the G' to G peaks ratio exceeded two, as expected for good quality monolayer graphene; both for hexagonal and irregularly shaped flakes. A line profile of the selected area electron diffraction pattern (see the inset of FIG. 2b) provided additional supporting evidence for monolayer graphene. The hexagonal shape of the flakes indicated good crystallinity, but in order to confirm this, selected area electron diffraction (SAED) patterns of a number of widely separated points of a large-area graphene flake transferred to a TEM grid were recorded. The rotation of the diffraction patterns was very small and confirmed that the synthesised graphene was indeed a single crystal (see FIG. 2b).

When the silicidated samples were cooled down very quickly, the formation of striation on some Pt grains was observed that sometimes lead to very directional cracks in graphene or, in some cases, graphene flake dislocations (see FIG. 2d). The striations appeared likely due to the silicide crystallisation or phase change. The strain upon rapid cooling may have induced cracks in graphene. These cracks only formed when graphene was quenched and when the substrate was covered with a thick silicide layer. Marginally slow cooling rates of less than 30° C./min in ultra-pure Ar with a sufficiently thin silicide layer did not appear to have the cracks, thus providing some control over the graphene ribbon formation. Alternatively, these cracks can be "healed" with a short second synthesis stage at a temperature below the re-crystallisation temperature of the silicide.

The CVD grown graphene was transferred onto 300 nm SiO$_2$/Si substrates and a device with a Hall bar geometry was fabricated for electronic characterisation (53 μm×20 μm). The field-effect mobility ranged from 740~900 cm$^2$ V$^{-1}$s$^{-1}$ for carder densities of 8×10$^{12}$ to 2×10$^{12}$ cm$^{-2}$, which is typical for graphene grown by CVD and transferred to SiO$_2$/Si substrates. It is expected that this value can be improved significantly with transfer-free graphene or if graphene is placed on boron nitride.

Substrate and Mechanism Analysis

Platinum is a noble metal that is very non-reactive; only hot aqua regia, a mix of concentrated nitric and hydrochloric acids can successfully attack it. Silicon dioxide (SiO$_2$), fused silica or quartz may be described similarly due to the strong Si—O bond, which can be broken by the hydrofluoric acid or some strong bases. However, when these compounds are in contact in a reducing H$_2$ atmosphere at elevated temperatures the silica may reduce to silicon, catalysed by platinum, and react with platinum to form various phases of platinum silicide. The two simplified reactions are given below:

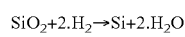

$$SiO_2 + 2.H_2 \rightarrow Si + 2.H_2O$$

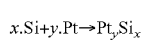

$$x.Si + y.Pt \rightarrow Pt_y Si_x$$

If pure silicon is deposited onto platinum, then the reaction proceeds quicker and starts at lower temperatures. Other films, such as SiO, SiN also react in a similar fashion. A boron nitride holder was found to be the most suitable for the platinum due to its stability in a reducing atmosphere and non-wetting by the silicide.

Figure 3:
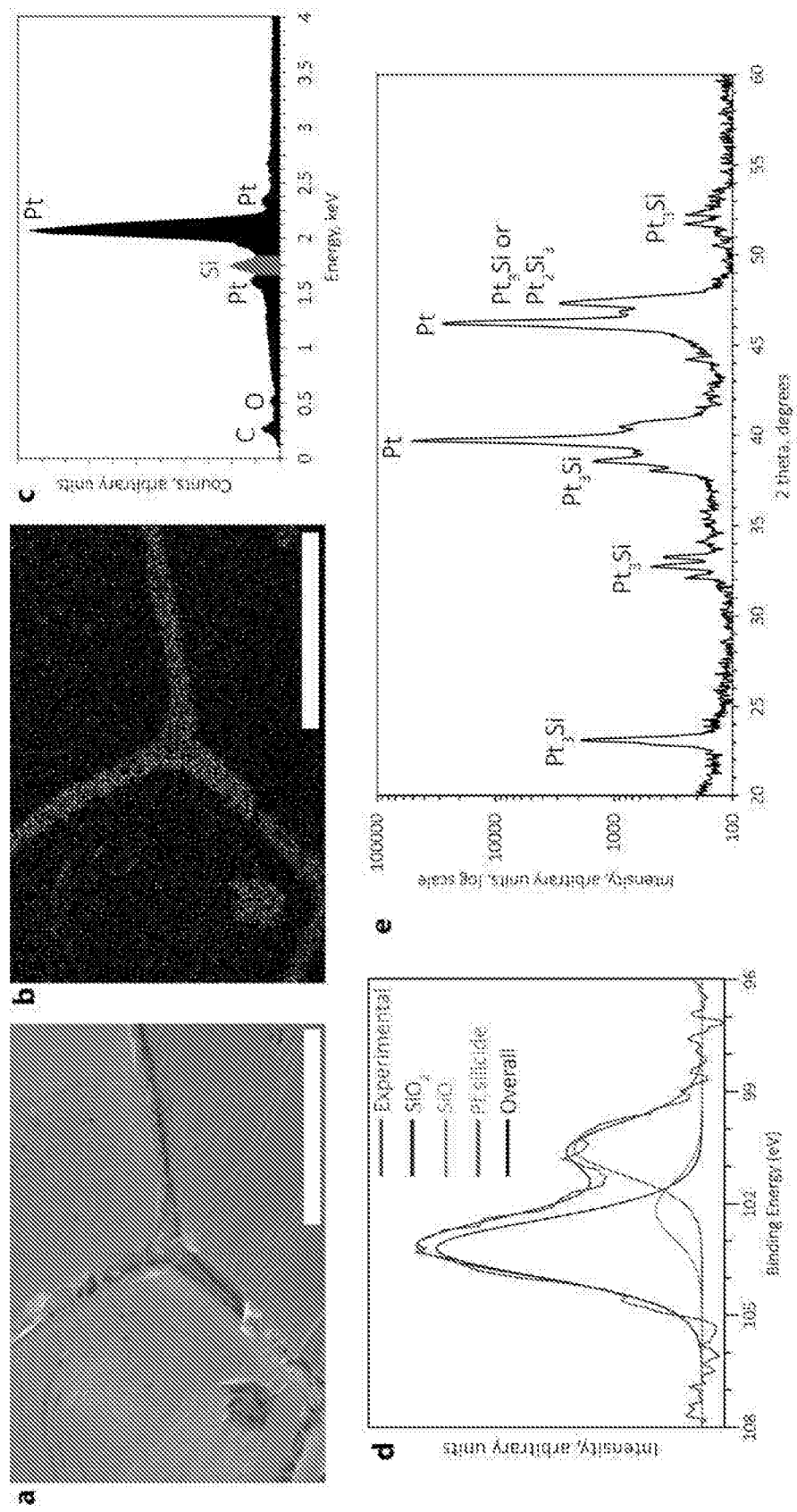
FIG. 3 provides a characterisation of a $Pt/SiO_2$ exemplar substrate after conditioning the substrate (annealing in hydrogen). Shown are: (a) an SEM image of the annealed and cooled substrate with a filled Pt grain boundary (scale bar: 30 μm); (b) an EDX map of the Si peak, showing the valleys filled with a silicon-rich compound (scale bar: 30 μm); (c) an EDX spectrum of the silicon-rich area; (d) an XPS spectrum with fitted peaks, showing matching silicide peak and silicon oxide peaks (from exposure to atmosphere); and (e) an XRD spectrum of the substrate (on log scale), confirming a platinum-rich phase (e.g. $Pt_3Si$).

To form the silicide, a one-step CVD-based process was developed with a tetraethyl orthosilicate (TEOS) precursor introduced by the Ar carrier gas. Other methods such as evaporation and sol-gel deposition of Si/SiO/SiO$_2$ were also explored, but did not show any advantages over TEOS CVD, which was fast, cheap and could potentially be performed in the same CVD reactor. To synthesise graphene, the Pt/SiO$_2$ stack was subjected to an optimised CVD procedure that consisted of the annealing stage, synthesis stage and the cooling stage. A number of complimentary characterisation techniques were used on the annealed and cooled substrate to identify its composition just before the carbon precursor was introduced. FIGS. 3a and 3b show an SEM image of a grain boundary of the substrate and its corresponding Energy-Dispersive X-ray (EDX) spectral map of the silicon peak. The grain boundary and the small topographic defect have higher silicon content compared to the surroundings. The silicon peak is very prominent (see FIG. 3c) in such valleys. A variety of liquid features and striations were present on most Pt grains, indicating that there may have been a very thin silicide layer. X-ray photoelectron spectroscopy (XPS) was used to identify the surface chemical composition of the substrate that detected a Pt silicide peak at around 100.5 eV (see FIG. 3d), but also the SiO/SiO$_2$ peaks were observed which most likely formed when the thin silicide was exposed to air. Complimentary X-Ray Diffraction (XRD) analysis was performed to confirm the chemical composition, but also to identify the phase of the silicide after cooling down. For this, a thick SiO$_2$ film was deposited to get the material in excess, resulting in the formation of the monoclinic Pt$_3$Si phase and possibly other platinum-rich phases (see FIG. 3e).

Figure 4:
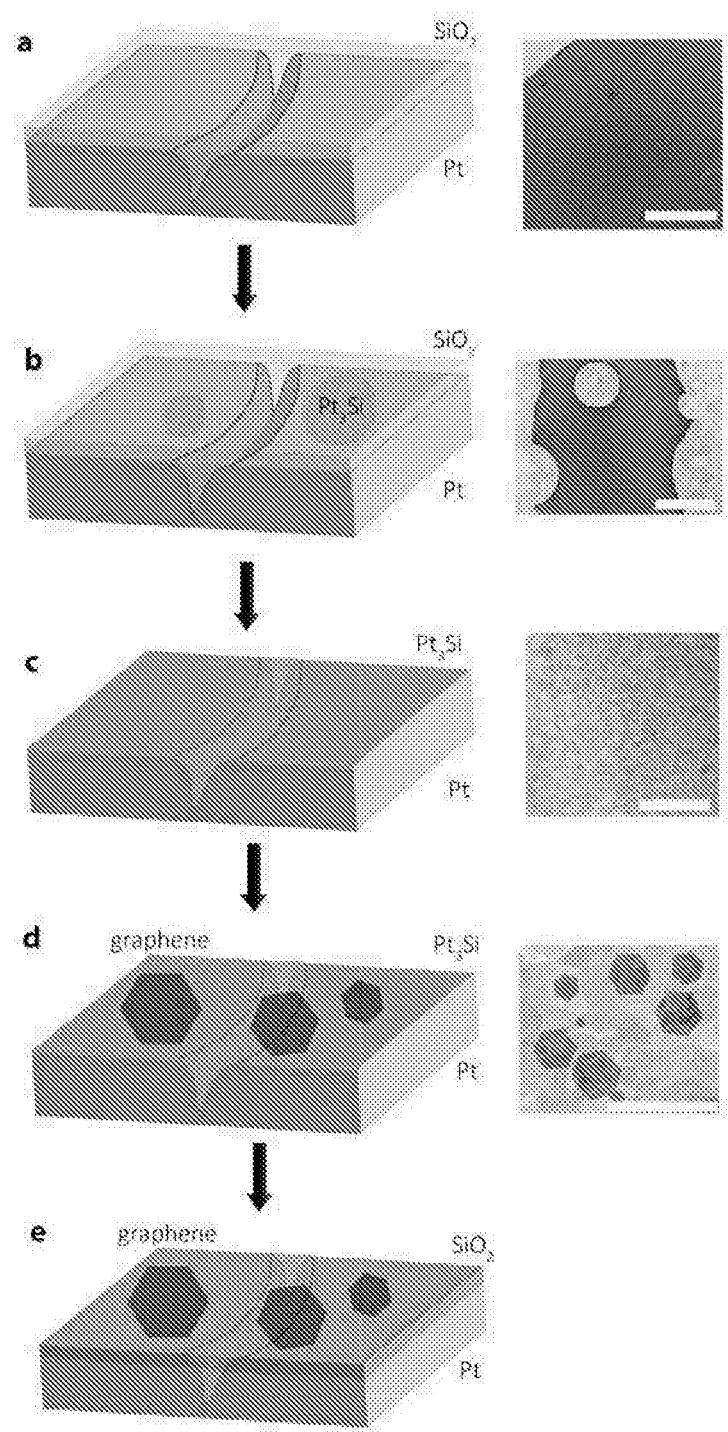
FIG. 4 depicts various stages of silicide and transfer-free graphene formation, and includes diagrams (left) with supporting SEM images (right). The following stages are depicted: (a) the substrate is coated with a $SiO_2$ film; (b) upon annealing a spontaneous reaction occurs resulting in circular holes in the $SiO_2$ film, filled with a silicide layer; (c)

Thus, the use of clean platinum and platinum with a silicide layer resulted in different graphene flake morphology. In terms of the cause of this effect, most platinum silicide phases have reduced (eutectic) melting points, especially in the form of a thin film. For example, the identified monoclinic Pt$_3$Si phase melts at around 870° C. Without wishing to be bound by theory, a simple mechanism of the silicide formation based on the observations of the SiO$_2$ film before annealing and after annealing for various times is proposed. The proposed mechanism is illustrated in FIG. 4, which shows a diagram of the mechanism and the corresponding SEM images of a Pt/SiO$_2$ stack. The deposited silica layer is not conductive and looks dark under the electron beam. Upon heating, a spontaneous reaction occurs in a variety of points in the film that start to spread in a circular manner. The circular holes are filled with a thin layer of conductive liquid and look similar to the clean platinum (see FIGS. 4b and 4c). The silicide may be evaporating from the surface, diffusing into the bulk and filling any topographical defects, such as Pt grain boundaries. It should be noted that the annealing time becomes an important parameter. As soon as the SiO$_2$ thin film completely reacts with platinum it is the right time to start graphene synthesis. With the formation of the silicide layer the ratio of H$_2$ to CH$_4$ may be increased by as much as 70%. This is an important factor for single-crystal, monolayer graphene growth, since H$_2$ is reported to act as an etchant of carbonaceous materials. The difference in the kinetics for graphene nucleation and its growth may be the key to explain this observation. On clean platinum, the nucleation is very inhibited when H$_2$ is in excess, whereas a "sticky" liquid silicide layer may promote nucleation. Other chemical influences in addition to simple mechanical (liquid) effects are not ruled out, for example the silicide route may produce silicon carbide as an intermediate state.

Graphene Crystallinity Control

Good crystallinity is an important quality factor of CVD-grown graphene, as it offers superior electronic and tensile properties, chemical resistivity and impermeability. The ability to control the crystallinity allows the material to be improved. A systematic investigation into the effect of the thickness of the deposited silica layer on the hexagonality of graphene flakes was conducted. The results are presented in FIG. 5. The trend matches well with the expectation: the more silica there is, the thicker the silicide layer and thus the flakes grow more independently from the underlying solid substrate. The hexagonality saturated with about a 800 nm-thick silica layer. Another important quality indicator, the uniformity of the shapes, also decreases significantly from about 50% fluctuation at 0 nm to less than 5% at 800 nm, as shown by the error bars. The maximum thickness of the deposited layer is limited by the thickness of the Pt foil, since it may start degrading.

In conclusion, it has been found that graphene synthesis on silicidated polycrystalline platinum exhibits low nucleation density and exceptionally high growth rates, allowing millimeter-sized flakes to grow easily in minutes. The silicide film formation on the substrates is an important parameter for graphene growth and has beneficial effects if controlled. The present processes may be used as an alternative to polishing and grain enlargement. Increased growth rates, the ability to reuse the substrate and the high quality of the synthesised graphene may make the present processes commercially feasible. There are also potentially useful features such as the ability to directly grow anisotropically conducting films. Moreover, as the following Examples illustrate, other metallic substrates may be useful in the present processes, and two-dimensional nanomaterials other than graphene may also be grown.

Example 2

Following similar procedures, hexagonal flakes of monolayer graphene can be grown on silicidated palladium foils. By way of illustration, hexagonal monolayer graphene flakes of about 300 μm size with about 3 mm nucleation point separation can be achieved by depositing a 50 nm SiO$_2$ layer, followed by annealing at 1150° C. with hydrogen flow of 200 sccm for 30 minutes, followed by a 15 minute synthesis stage with 1.8 sccm methane and 600 sccm hydrogen.

Example 3

Moreover, similar procedures may be used to grow hexagonal boron nitride on silicidated platinum. By way of illustration, a SiO$_2$ film of about 1 μm is deposited on pristine Pt with CVD by passing Ar gas (350 sccm) through a TEOS precursor at about 700° C. The substrate is annealed under 200 sccm hydrogen flow for 30 minutes at 1070° C. to form the silicide. Hexagonal boron nitride is then grown by CVD. The vapour of ammonia borane precursor (100 mg in a quartz container, heated to around 100° C.) is carried by a 10 sccm flow of hydrogen, this flow is then diluted with 200 sccm of hydrogen in a quartz tube. The flow through the quartz tube enters a furnace heated to 1000° C. with the hot silicidated Pt substrate. The synthesis time is 30 minutes, after which the substrate is quenched by moving the furnace away from the substrate.

It will be understood that the present invention has been described purely by way of example, and modification of detail can be made within the scope of the invention. Each feature disclosed in the description, and where appropriate the claims and drawings, may be provided independently or in any appropriate combination.

The invention claimed is:

1. A process for producing a two-dimensional nanomaterial, the process comprising forming the two-dimensional nanomaterial on a surface of a substrate by chemical vapour deposition (CVD), wherein said surface is a liquid surface which comprises a molten eutectic compound, wherein the two-dimensional nanomaterial is graphene, a graphene derivative, boron nitride, or a transition metal chalcogenide, and wherein the two-dimensional nanomaterial comprises from 1 to 20 monolayers and has a thickness of from 0.3 nm to 10 nm, wherein the eutectic compound is a metal silicide.

2. The process according to claim 1, wherein the eutectic compound is a platinum silicide, a palladium silicide, a copper silicide or a nickel silicide.

3. The process according to claim 1, wherein the process further comprises a step of forming the substrate from a substrate precursor, wherein the substrate precursor comprises a first layer formed of a first material and, disposed on a surface thereof, a second layer formed of a second material, wherein the substrate is formed by conditioning the substrate precursor such that the first material and the second material react to form the eutectic compound.

4. The process according to claim 3, wherein the first material comprises a metal.

5. The process according to claim 4, wherein the metal is a transition metal selected from platinum, palladium, copper, and nickel.

6. The process according to claim 5, wherein the transition metal is platinum or palladium.

7. The process according to claim 3, wherein the first layer comprises one or more topological defects or grain boundaries that are concealed by the second layer.

8. The process according to claim 3, wherein the second material comprises a silicon-containing species.

9. The process according to claim 8, wherein the second material comprises one or more of Si, SiO, $SiO_2$, and SiN.

10. The process according to claim 9, wherein the second material comprises $SiO_2$.

11. The process according to claim 3, wherein the substrate and the two-dimensional nanomaterial are both formed in the same CVD chamber.

12. The process according to claim 1, wherein the step of forming the two-dimensional nanomaterial comprises contacting the liquid surface with one or more precursors for the two-dimensional nanomaterial.

13. The process according to claim 1, wherein the process further comprises: (i) a step of cooling the substrate and the two-dimensional nanomaterial formed thereon; and/or (ii) a step of separating the two-dimensional nanomaterial from the substrate.

14. The process according to claim 1, wherein the two-dimensional nanomaterial is an electrical conductor and the process further comprises forming a layer of an electrical insulator in contact with said two-dimensional nanomaterial, optionally wherein the process comprises forming said layer of electrical insulator from said substrate.

15. The process according to claim 1, wherein the process further comprises forming an electronic device comprising said two-dimensional nanomaterial.

16. The process according to claim 1, wherein the two-dimensional nanomaterial is graphene, a graphene derivative, boron nitride or a transition metal chalcogenide.

17. The process according to claim 16, wherein the two-dimensional nanomaterial is graphene.

* * * * *